(12) United States Patent
Choi et al.

(10) Patent No.: US 10,866,476 B2
(45) Date of Patent: Dec. 15, 2020

(54) DISPLAY DEVICE AND METHOD FOR MANUFACTURING THE SAME

(71) Applicant: SAMSUNG DISPLAY CO., LTD., Yongin-si (KR)

(72) Inventors: Seongsik Choi, Seoul (KR); Cheuljin Park, Seoul (KR); Dawoon Kim, Seoul (KR); Youngsu Kim, Gunpo-si (KR); Hyunchul Bae, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/129,865

(22) Filed: Sep. 13, 2018

(65) Prior Publication Data

US 2019/0094641 A1  Mar. 28, 2019

(30) Foreign Application Priority Data

Sep. 25, 2017  (KR) .......................... 10-2017-0123621

(51) Int. Cl.
*G02F 1/1333* (2006.01)
*G02F 1/1345* (2006.01)
(Continued)

(52) U.S. Cl.
CPC ...... *G02F 1/136286* (2013.01); *G02F 1/1339* (2013.01); *G02F 1/13452* (2013.01); *G02F 1/133305* (2013.01); *G02F 1/133528* (2013.01); *H01L 27/1214* (2013.01); *H01L 27/1218* (2013.01); *H01L 51/003* (2013.01);
(Continued)

(58) Field of Classification Search
CPC ............. H01L 27/1214; H01L 27/1218; H01L 27/3276; H01L 27/3244; H01L 27/3293; H01L 51/003; H01L 51/0097; H01L 51/5246; H01L 23/4985; H01L 27/3262; H01L 27/3297; H01L 27/3288; H01L 51/5203; H01L 23/5387; H01L 29/41733; H01L 29/78669; H01L 29/78678; G02F 1/13452; G02F 1/136286; G02F 1/133305; G02F 1/1345; G02F 1/13454; G02F 1/1333; G02F 1/133345; G02F 1/13306; G02F 1/1335; G02F 1/133528; G02F 1/1339; G02F 2001/13456; G02F 1/1368; G02F 1/1343; G02F 1/134309; G02F 1/13458;
(Continued)

(56) References Cited

U.S. PATENT DOCUMENTS 8,944,875 B2   2/2015  Kim
2011/0007042 A1*  1/2011  Miyaguchi .............. G02F 1/167
                                          345/204

(Continued)

FOREIGN PATENT DOCUMENTS

KR   1020140110562 A   9/2014

*Primary Examiner* — Thoi V Duong
(74) *Attorney, Agent, or Firm* — Cantor Colburn LLP

(57) ABSTRACT

A display device includes: a first substrate including a display area at which an image is displayed, a non-display area adjacent to the display area, and a first bent portion in the non-display area thereof, the first bent portion disposed in a plane inclined to a plane in which the display area is disposed; a second substrate opposing the first substrate; and a sealing portion which is disposed in the non-display area and attaches the first substrate and the second substrate to each other.

8 Claims, 7 Drawing Sheets

(51) Int. Cl.
*G02F 1/1335* (2006.01)
*G02F 1/1339* (2006.01)
*G02F 1/1362* (2006.01)
*H01L 27/12* (2006.01)
*H01L 51/00* (2006.01)
*H01L 27/32* (2006.01)

(52) U.S. Cl.
CPC .............. *H01L 51/0097* (2013.01); *G02F 2001/13456* (2013.01); *H01L 27/3276* (2013.01); *H01L 27/3293* (2013.01)

(58) Field of Classification Search
CPC ........ G02F 2001/133388; H05K 3/361; H05K 1/028; G09G 2300/0426; G09G 3/3655
See application file for complete search history.

(56) References Cited

U.S. PATENT DOCUMENTS

| | | |
|---|---|---|
| 2014/0042406 A1 | 2/2014 | Degner et al. |
| 2016/0181345 A1 | 6/2016 | Lee et al. |
| 2017/0062773 A1 | 3/2017 | Lee et al. |
| 2018/0007789 A1* | 1/2018 | Kawata ............... H01L 27/3244 |

* cited by examiner

DISPLAY DEVICE AND METHOD FOR MANUFACTURING THE SAME

This application claims priority to Korean Patent Application No. 10-2017-0123621, filed on Sep. 25, 2017, and all the benefits accruing therefrom under 35 U.S.C. § 119, the content of which in its entirety is herein incorporated by reference.

BACKGROUND

1. Field

Embodiments of the invention relate to a display device and to a method of manufacturing the display device, and more particularly, to a display device including a narrow bezel and to a method of manufacturing the display device.

2. Description of the Related Art

Flexible display devices that are bendable are being developed. Such flexible display devices may be used in various fields because a flexible display device can be used in a folded or curved form. Flexible display devices refer to a display device in which a display element with which an image is generated is disposed on a flexible substrate.

Examples of display elements applicable to such flexible display devices may include organic light emitting diodes ("OLED"), liquid crystal display ("LCD") elements and electrophoretic display ("EPD") elements. Among these, OLEDs are attracting attention as display elements of such flexible display devices because such display elements may be manufactured into a stack structure of a relatively thin film type to have excellent flexibility.

SUMMARY

Embodiments of the invention may be directed to a display device including a narrow bezel and to a method of manufacturing the display device.

According to an exemplary embodiment, a display device includes: a first substrate including a display area at which an image is displayed, a non-display area adjacent to the display area, and a first bent portion in the non-display area thereof, the first bent portion disposed in a plane inclined to a plane in which the display area is disposed; a second substrate opposing the first substrate; and a sealing portion which is disposed in the non-display area and attaches.

The display device may further include a first polarization plate at a back surface of the first substrate. The first bent portion may contact an end side surface of the first polarization plate, and the end side surface of the first polarization plate may be coplanar with respect to an end side surface of the second substrate.

The display device may further include: a display element with which the image is displayed, in the display area; a driving element from which a driving signal is provided to the display element for displaying the image, in the non-display area; and a first wiring portion which connects the driving element and the display element to each other and through which the driving signal is transmitted from the driving element to the display element. The first wiring portion may extend along the non-display area to be bent along the first bent portion.

The display device may further include: a printed circuit board from which the driving signal is provided to the driving element, and a second wiring portion which connects the driving element and the printed circuit board to each other. The driving element, the printed circuit board, and the second wiring portion may be disposed along the first bent portion.

The display device may further include: a display element with which the image is displayed, in the display area, a driving element from which a driving signal is provided to the display element for displaying the image, in the non-display area, and a first wiring portion which connects the driving element and the display element to each other and through which the driving signal is transmitted from the driving element to the display element. The first substrate may further include a second bent portion extended from an end of the first bent portion, the second bent portion disposed in a plane inclined to the plane in which the first bent portion is disposed, the second bent portion of the first substrate may contact a back surface of the first substrate, and the first wiring portion may extend along the non-display area to be bent along the first bent portion and along the second bent portion.

The display device may further include: a printed circuit board from which the driving signal is provided to the driving element, and a second wiring portion which connects the driving element and the printed circuit board to each other. The driving element, the printed circuit board, and the second wiring portion may be disposed along the second bent portion.

The first bent portion of the first substrate may be bent along a bending line defined in the non-display area. A distance from a bending line of the first bent portion to a boundary between the display area and the non-display area may be in a range from about 1 millimeter (mm) to about 4 millimeters (mm).

The display device may further include: a second polarization plate at a front surface of the second substrate. An end side surface of the second polarization plate and an end side surface of the second substrate may be coplanar with each other.

The first substrate may include polyimide.

According to an exemplary embodiment, a method of manufacturing a display device includes: forming a release layer including graphene, on a support substrate; disposing a first substrate of a display device which displays an image at a display area of the first substrate, on the release layer on the support substrate; forming on the first substrate which is on the release layer, a display element of the display device with which the image is displayed, in the display area of the first substrate; separating the release layer together with the support substrate from the first substrate including the display element formed thereon; and firstly bending the separated first substrate including the display element formed thereon, at a non-display area of the first substrate which is adjacent to the display area thereof, to dispose a first bent portion of the first substrate in a plane inclined to a plane in which the display area is disposed.

The graphene may be formed by a reduction method using a graphene oxide material disposed on the support substrate or may be formed by a method of separately forming a graphene layer and then transferring the graphene layer to the support substrate.

The release layer may be formed to a thickness of about 10 nanometers (nm) or more and about 50 nm or less.

The first substrate may be separated from the release layer by a force of about 200 gram-force (gf) or more and about 300 gf or less.

The method may further include, before separating the release layer and the support substrate from the first substrate: disposing on the first substrate which is on the release layer: a driving element from which a driving signal is provided to the display element for displaying the image, in the non-display area, and a first wiring portion which connects the driving element and the display element to each other; disposing a second substrate facing the first substrate to cover the display area thereof; sealing the second substrate to the first substrate at the non-display area of the first substrate; and injecting liquid crystals between the first substrate and the second substrate to form a liquid crystal layer.

The method may further include, after separating the release layer and the support substrate from the first substrate: disposing a first polarization plate on a back surface of the first substrate. The first bent portion may contact an end side surface of the first polarization plate.

The first wiring portion may extend along the first bent portion.

The method may further include: providing a printed circuit board of the display device from which the driving signal is provided to the driving element, and disposing on the first substrate which is on the release layer, a second wiring portion which connects the driving element and the printed circuit board to each other and through which the driving signal is transmitted from the printed circuit board to the driving element. The driving element, the printed circuit board, and the second wiring portion may be disposed along the first bent portion.

The method may further include: secondarily bending the first bent portion of the separated first substrate including the display element formed thereon, to dispose a second bent portion of the first substrate in a plane inclined to the plane in which the first bent portion is disposed. The second bent portion may contact a back surface of the first substrate, and the first wiring portion which connects the driving element and the display element to each other may extend along the first bent portion and along the second bent portion.

The first substrate may be firstly bent along a bending line defined in the non-display area of the first substrate. A distance from the bending line of the first bent portion to a boundary between the display area and the non-display area may be in a range from about 1 mm to about 4 mm.

The first substrate may include polyimide.

The foregoing is illustrative only and is not intended to be in any way limiting. In addition to the illustrative features, exemplary embodiments and features described above, further features, exemplary embodiments and features will become apparent by reference to the drawings and the following detailed description.

BRIEF DESCRIPTION OF THE DRAWINGS

A more complete appreciation of the invention will become more apparent by describing in detail exemplary embodiments thereof with reference to the accompanying drawings, where.

DETAILED DESCRIPTION

Figure 1:
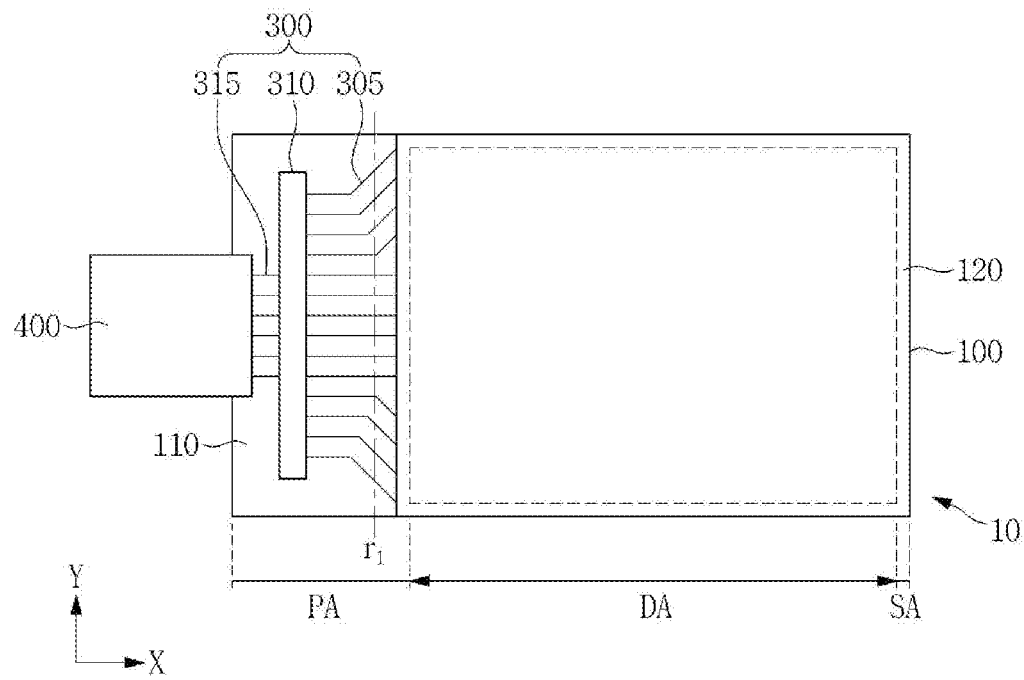
FIG. 1 is a top plan view illustrating an exemplary embodiment of a display device according to the invention.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area or plate is referred to as being related to another elements such as being "on" another layer, area or plate, it may be directly on the other layer, area, or plate, or intervening layers, areas, or plates may be present therebetween. Conversely, when a layer, area, or plate is referred to as being related to another element such as being "directly on" another layer, area or plate, intervening layers, areas or plates are absent therebetween. Further when a layer, area, or plate is referred to as being related to another element such as being "below" another layer, area or plate, it may be directly below the other layer, area or plate, or intervening layers, areas, or plates may be present therebetween. Conversely, when a layer, area, or plate is referred to as being related to another element such as being "directly below" another layer, area or plate, intervening layers, areas or plates are absent therebetween.

The spatially relative terms "below," "beneath," "lower," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "mechanically connected" or "physically connected" to the other element, or "electrically connected" to the other element with one or more intervening elements interposed therebetween.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification. Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Some of the parts which are not associated with the description may not be provided in order to specifically describe embodiments of the invention and like reference numerals refer to like elements throughout the specification.

There have been tendencies that a display device becomes overall slimmer and lighter, and that a width of a bezel of the display device is reduced. Display devices including a relatively narrow bezel have advantages in that the narrow-bezel display devices are superior in terms of design and using a number of such individual display devices reduces an interval between adjacent display devices when forming a relatively large-sized display device using a number of the individual display devices.

However, implementing a display device including a relatively narrow bezel may be difficult due to wirings, a driving circuit and/or a sealing member located at a non-display area which surrounds a display area. A dimension of a bezel of a display device is directly related to the non-display area of the display device which is adjacent to the display area thereof.

Hereinafter, an exemplary embodiment of a display device according to the invention will be described in detail with reference to FIGS. 1, 2, and 3.

Figure 2:
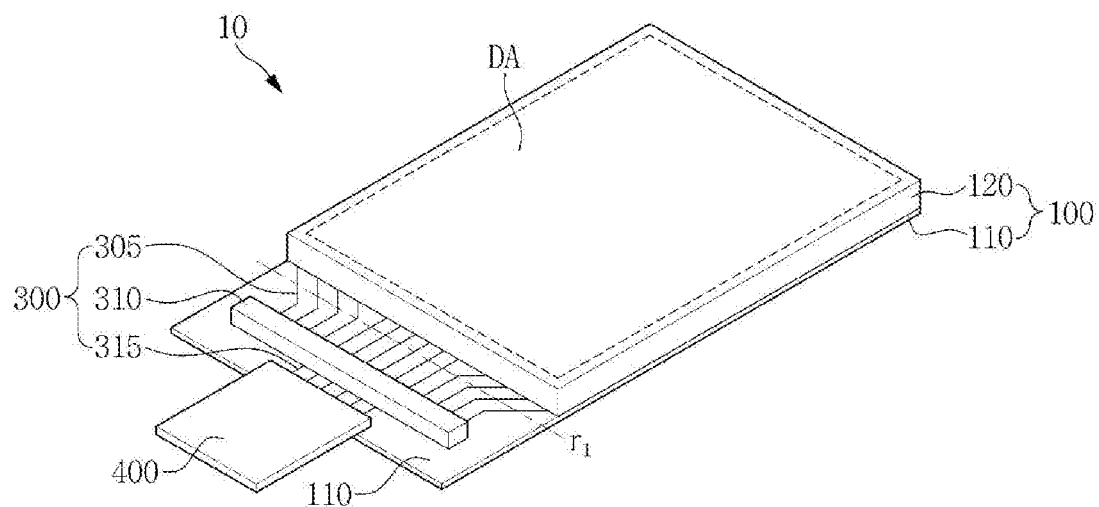
FIG. 2 is a perspective view illustrating the display device of FIG. 1 according to the invention.
Figure 3:
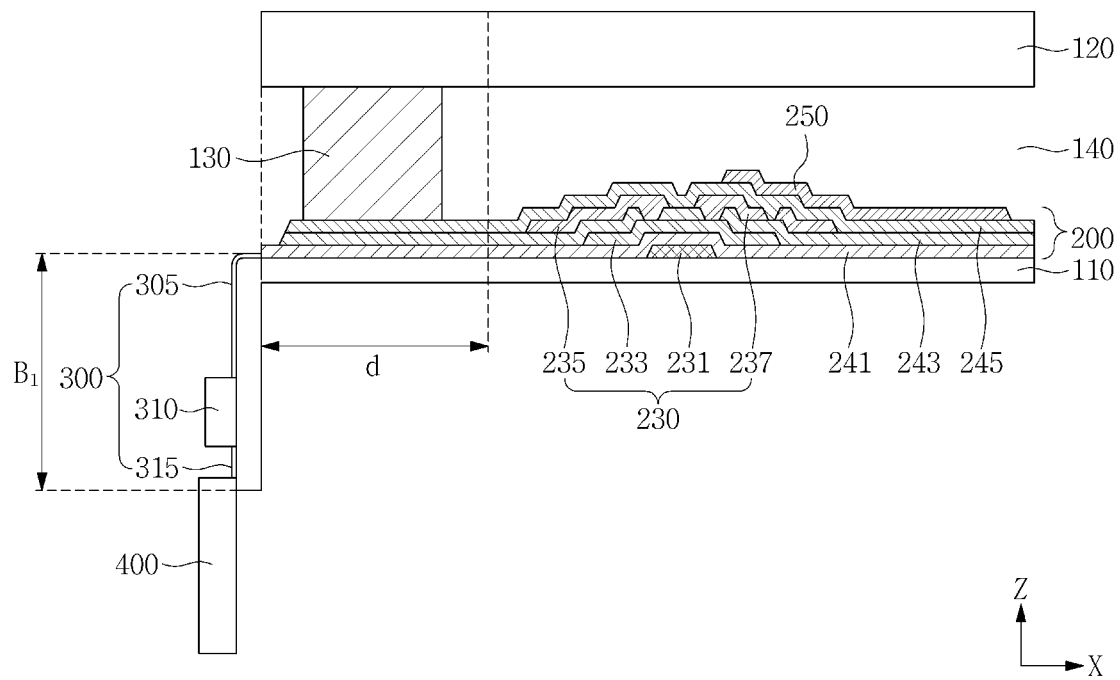
FIG. 3 is a cross-sectional view illustrating the display device of FIGS. 1 and 2 in a bent state according to the invention.

FIG. 1 is a top plan view illustrating a display device according to the invention, FIG. 2 is a perspective view illustrating the display device of FIG. 1 according to the invention, and FIG. 3 is a cross-sectional view illustrating the display device of FIGS. 1 and 2 in a bent state according to the invention.

Referring to FIGS. 1, 2 and 3, a display device 10 according to an exemplary embodiment includes a display panel 100, a driving element 310, a printed circuit board ("PCB") 400, and a plurality of wirings 300 connecting a display element of the display panel 100, the driving element 310 and the PCB 400 to each other.

The display panel 100 may be provided in a quadrangular plate shape and serve to receive an electric signal from outside thereof and display images in response to the electrical signal.

The display panel 100 according to an exemplary embodiment includes a first (display) substrate 110, a second (display) substrate 120 opposing the first substrate 110, and an optical control or transmittance layer such as a liquid crystal layer 140 between the first substrate 110 and the second substrate 120.

The first substrate 110 includes a display area DA and a non-display area as a collection of PA and SA. The non-display area includes a pad area PA and a surrounding area SA. The plurality of wirings 300 and a pad terminal are disposed at the pad area PA. The surrounding area SA corresponds to an area of the first substrate 110 except for the display area DA and the pad area PA. As such, planar areas of the display area DA, the pad area PA and the surrounding area SA define an entirety of a total planar area of display panel 100.

The second substrate 120 is disposed to oppose the first substrate 110, a display area of the second substrate corresponds to the display area of the first substrate 110, and a planar area of the second substrate 120 except for that of the display area thereof corresponds to a non-display area thereof. The non-display area of the second substrate 120 may be in the form of a frame surrounding the display area DA in the top plan view, without being limited thereto. The display device 10 illustrated in FIGS. 1 and 2, and components thereof, are disposed in a plane defined by first and second directions which cross each other (e.g., X-direction and Y-direction). A thickness of the display device 10 and components thereof is taken in a third direction which crosses each of the first and second directions (e.g., Z-direction). FIGS. 1 and 2 illustrate the display device 10 in a flat (e.g., unbent state).

The first substrate 110 may include a flexible material. Examples of the flexible material may include a plastic material. In an exemplary embodiment, for example, the first substrate 110 may include at least one selected from kapton, polyethersulphone ("PES"), polycarbonate ("PC"), polyimide ("PI"), polyethyleneterephthalate ("PET"), polyethylene naphthalate ("PEN"), polyacrylate ("PAR"), fiber reinforced plastic ("FRP"), and the like.

Among the materials of the first substrate 110, polyimide ("PI") is excellent in heat resistance and is suitable for a material forming the first substrate 110 which may undergo a high-temperature process in a method of manufacturing a display device.

A thickness of the first substrate 110 may be about 10 micrometers (μm) or more and about 50 μm or less.

A display element portion 200 to be described below is disposed on the first substrate 110.

Referring to FIG. 3, a portion of the first substrate 110 is bent downwards (−Z direction) with respect to a bending line or axis r1 defined at the pad area PA, such that an area of the first substrate 110 and components thereon disposed outside the bending line r1 is disposed substantially perpendicular to the display area of the first substrate 110. The area of the first substrate 110 and components thereon disposed substantially perpendicular to the display area of the first substrate 110 is called 'a bent portion.' The bent portion may form an angle with respect to a plane (X-Y plane) in which a remainder of the display device 10 is disposed. The angle at which the bent portion is bent may be close to about 90 degrees with respect to the plane in which the remainder of the display device 10 is disposed. A distance from the bending line r1 to a boundary between the display area DA and the non-display area is in a range from about 1 millimeter (mm) to about 4 mm.

In order to attach the first substrate 110 and the second substrate 120 to each other, a sealing portion 130 is disposed between the first substrate 110 and the second substrate 120. In an exemplary embodiment, for example, the sealing portion 130 is disposed between the non-display area of the first substrate 110 and the non-display area of the second substrate 120 which opposes the non-display area of the first substrate 110.

The sealing portion 130 may be in the form of a frame having a closed-loop shape which surrounds the display area DA.

The plurality of wirings 300 include a first wiring portion 305, a second wiring portion 315, and a pad terminal portion (not illustrated). Each of the first wiring portion 305 and second wiring portion 315 may include a plurality of individual (conductive) wiring lines through which control, driving and/or voltage signals are transmitted to the display area DA of the display panel 100 from outside thereof. The pad terminal portion may include a plurality of pad terminals through which the signals are transmitted among the first and second wiring portions 305 and 315 and the driving element 310. The first wiring portion 305 may electrically connect the display element in the display area DA of the first substrate 110 and the driving element 310 on the pad terminal portion, to each other.

The first substrate 110 includes a bent portion B1 which is bent along a first bending line r1. The first wiring portion 305 extends in the X-direction, to dispose portions thereof on opposing sides of the first bending line r1. That is, portions of a same individual conductive wiring line may be disposed at opposing sides of the first bending line r1.

Accordingly, as the bent portion B1 of the first substrate 110 is bent at the first bending line r1, the first wiring portion 305 is bent at the first bending line r1.

Referring to FIG. 3, for example, a portion of the first wiring portion 305 is disposed bent downwards (−Z direction) with respect to the bending line r1 of the pad area PA. A portion of the first wiring portion 305 disposed outside the bending line r1 is disposed substantially perpendicular to the display area of the first substrate 110.

Accordingly, to be bendable, the first wiring portion 305 includes a flexible metal material in order to substantially minimize breakage when bending the substrate 110. In an exemplary embodiment, for example, the signal wiring may include copper (Cu) or a copper alloy.

The driving element 310 contacts the pad terminal portion (not illustrated) in a corresponding manner. That is, where the pad terminal portion includes a plurality of pad terminals on the first substrate 110, the driving element 310 may have pads or terminals corresponding in location, number, size, etc. to the pad terminals of the pad portion.

The driving element 310, the pad terminal portion, and the second wiring portion 315 are located further from the display area DA than the first wiring portion 305 along the first substrate 110. The driving element 310, the pad terminal portion, the first wiring portion 305 and the second wiring portion 315 are disposed on one surface of the first substrate 110 at the bent portion B1 thereof the first substrate 110 at a same side thereof.

The second wiring portion 315 electrically connects the driving element 310 to the PCB 400 which is external or separately provided relative to the display panel 100.

As such, the driving element 310 as a component mounted with a circuit chip or the like, receives a signal such as a driving signal from the external or separate PCB 400, via the second wiring portion 315. The driving element 310 may convert the driving signal input thereto, and supply the converted driving signal to the first wiring portion 305 to be further transmitted to the display element portion 200 in the display area DA. The driving element 310 according to an exemplary embodiment is described as being mounted on the first substrate 110, but exemplary embodiments are not limited thereto. The driving element may be mounted on separate PCB, flexible printed circuit board ("FPCB"), or the like.

A portion of a bezel of the display device 10, at an edge portion thereof, corresponds to the pad area PA at the non-display area of the display device 10. In the X-Y plane, the bent portion B1 of the first substrate 110 in an unbent state thereof (FIGS. 1 and 2) occupies a larger planar area than the bent portion B1 of the first substrate 110 in a bent state thereof (FIG. 3). Accordingly, by bending the first substrate 110 to dispose the bent portion B1 and layers thereon inclined with respect to the X-Y plane, a planar width of a side portion of the bezel may be reduced and the display device 10 including a relatively narrow bezel may be implemented.

Referring to FIG. 3, a thin film transistor and a display element which is connected to the thin film transistor are disposed and/or formed in the display area DA of the first substrate 110.

A thin film transistor 230 includes a gate electrode 231, a semiconductor layer 233, a source electrode 235 and a drain electrode 237. The thin film transistor 230 in the display area DA may be connected to the first wiring portion 305 in the non-display area pad area PA.

According to an exemplary embodiment, FIG. 3 illustrates the gate electrode 231 is disposed at a lower portion of the thin film transistor 230, the source electrode 235 and the drain electrode 237 are disposed at an upper portion of the thin film transistor 230, and the semiconductor layer 233 is interposed between the gate electrode 231 and each of the source and drain electrodes 235 and 237, respectively.

In addition to the thin film transistor 230, as illustrated in FIG. 3, a gate insulating layer 241 to insulate the gate electrode 231 and the semiconductor layer 233 from each other, an insulating interlayer 243 interposed between the semiconductor layer 233 and each of the source and drain electrodes 235 and 237, respectively, a protective layer 245 covering the thin film transistor 230, or the like may be disposed and/or formed in the display area DA.

In the case where the display device 10 is an LCD device, a pixel electrode 250 electrically connected to the thin film transistor 230 may be disposed or formed in the display area DA. In the case where the display device 10 is an OLED display device, a pixel electrode 250 electrically connected to the thin film transistor 230, a pixel defining layer covering the pixel electrode 250, an intermediate layer including a light emitting layer on the pixel electrode 250, and an opposing electrode (not illustrated) on the intermediate layer may be disposed or formed in the display area DA.

Layers in the display area DA, such as the gate insulating layer 241, the insulating interlayer 243 and the protective layer 245 may extend from the display area DA to be disposed in the surrounding area SA of the non-display area. According to an exemplary embodiment, the insulating interlayer 243, the protective layer 245 and the gate insulating layer 241 disposed in the display area DA may extend to below the sealing portion 130 in the non-display area. However, exemplary embodiments are not limited to the illustrated embodiments, and various modifications are possible. In another exemplary embodiment, for example, the gate insulating layer 241 disposed in the display area DA may not extend therefrom to below the sealing portion 130, and at least one of the insulating interlayer 243 and the protective layer 245 disposed in the display area DA may not extend therefrom to below the sealing portion 130.

Figure 4:
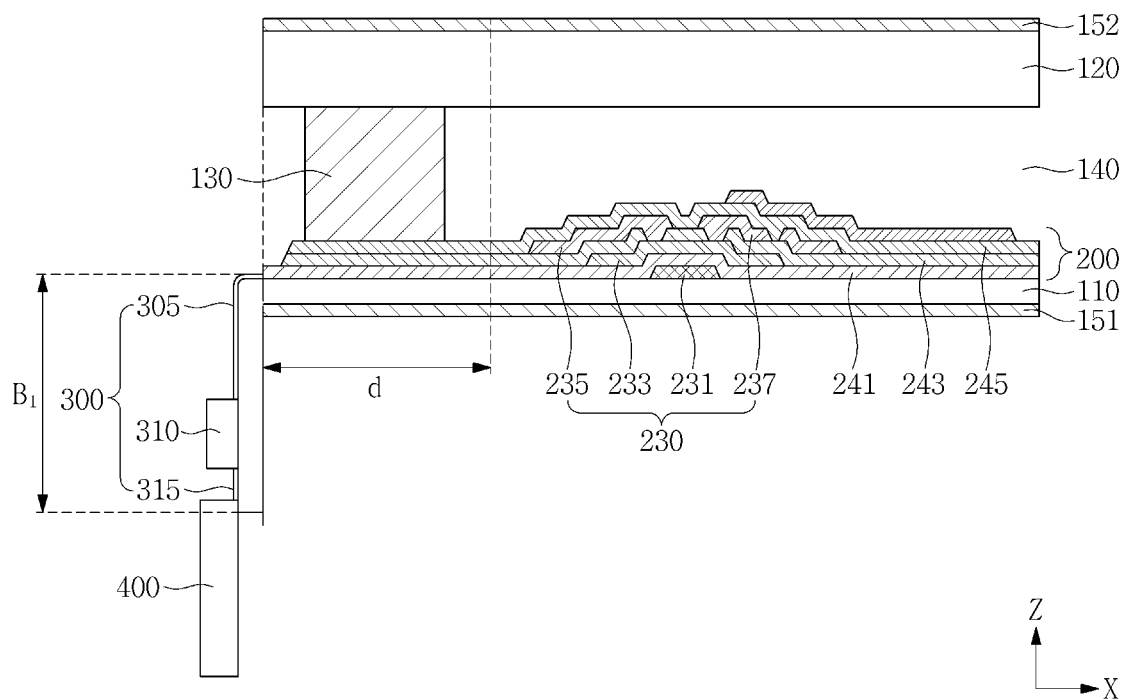
FIG. 4 is a cross-sectional view illustrating a modified exemplary embodiment of the display device of FIGS. 1 and 2 in a bent state according to the invention.

FIG. 4 is a cross-sectional view illustrating a modified exemplary embodiment of the display device of FIGS. 1 and 2 in a bent state according to the invention.

As illustrated in FIG. 4, a polarization plate 150 for compensating optical characteristics may be disposed on the display panel 100. For example, the polarization plate 150 may transmit only a specific polarized light among light arriving from the outside, and absorb or block the remaining light. In addition, the polarization plate 150 may substantially prevent reflection of external light.

A polarization plate member includes a first polarization plate 151 and a second polarization plate 152. The first polarization plate 151 and the second polarization plate 152 are respectively disposed on surfaces of the first substrate 110 and the second substrate 120 that are opposite to facing surfaces of the first substrate 110 and the second substrate 120, respectively. That is, the first polarization plate 151 may be attached to a back surface of the first substrate 110, and the second polarization plate 152 may be attached to an upper surface of the second substrate 120.

One end (or edge) of the first polarization plate 151 is aligned in a substantially same vertical plane (e.g., coplanar) with respect to a corresponding end of the second substrate 120, and one end of the second polarization plate 152 is arranged in the substantially same vertical plane with respect to the corresponding end of the second substrate 120. That is, one end of the first polarization plate 151, one end of the second substrate 120 and one end of the second polarization plate 152 are all aligned on a substantially same vertical plane to be coplanar with each other. In such an exemplary embodiment, the vertical plane is a virtual vertical plane perpendicular to the one surface (e.g., in the X-Y plane) of the second substrate 120.

Each of the first polarization plate 151 and the second polarization plate 152 may have a total planar area corresponding to a total planar area of the second substrate 120.

When the first polarization plate 151 is disposed at the first substrate 110, a side surface of the first substrate 110 at the first bent portion B1 thereof may contact the end (or edge) of the first polarization plate 151. A distance from the bending line r1 to a boundary between the display area DA and the non-display area is in a range from about 1 mm to about 4 mm.

The first polarization plate 151 and the second polarization plate 152 are respectively attached to the first and second substrates 110 and 120 such as by using an adhesive layer.

The adhesive layer which respectively attaches the first and second polarization plates 151 and 152 to the first and second substrates 110 and 120 may be a liquid adhesive without being limited thereto. In an exemplary embodiment, for example, a polarization plate may be disposed on a respective substrate coated with a liquid adhesive, and then the liquid adhesive may be cured to attach the substrate and the polarization plate to each other. Alternatively, the adhesive layer may be a double-sided tape. The adhesive layer may include at least one selected from an acrylic resin, an epoxy resin, a fluorine resin and a polytetrafluoroethylene ("PTFE") material such as Teflon™ resin.

Figure 5:
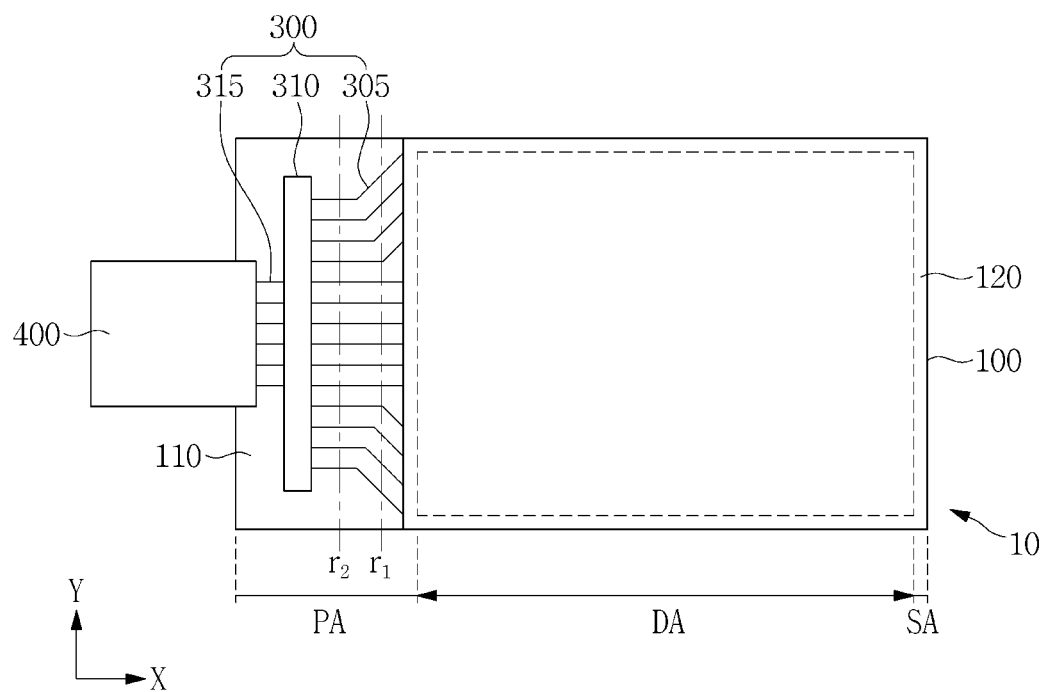
FIG. 5 is a top plan view illustrating another exemplary embodiment of a display device according to the invention.
Figure 6:
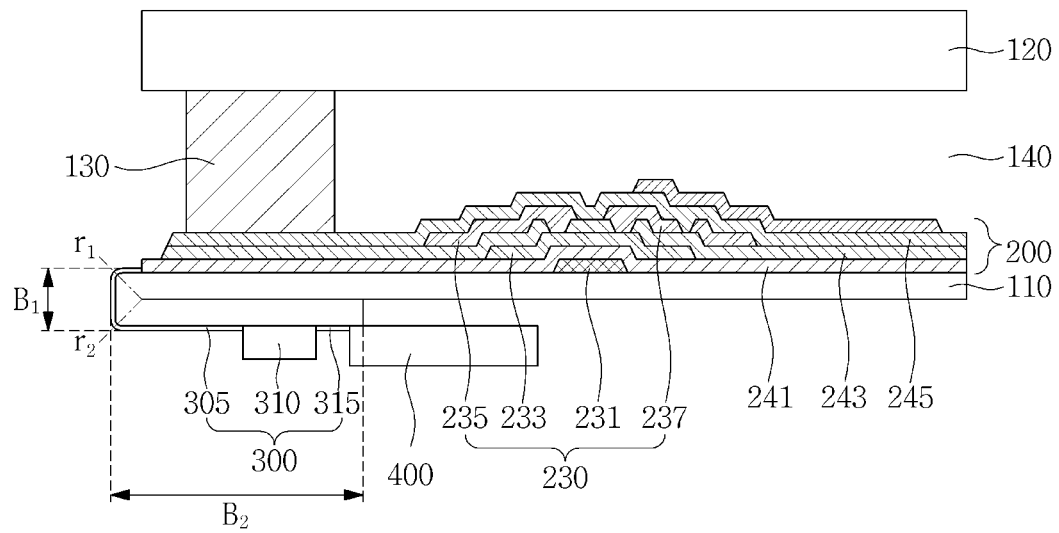
FIG. 6 is a cross-sectional view illustrating the display device of FIG. 5 in a bent state according to the invention.

FIG. 5 is a top plan view illustrating another exemplary embodiment of a display device according to the invention, and FIG. 6 is a cross-sectional view illustrating the display device of FIG. 5 in a bent state according to the invention.

FIGS. 5 and 6 illustrate an embodiment in which the first bent portion of the display device according to an exemplary embodiment is secondarily bent.

As illustrated in FIG. 5, a first substrate 110 includes a first bent portion B1 which is firstly bent along a first bending line r1 and a second bent portion B2 which is secondarily bent along a second bending line r2.

In an exemplary embodiment, for example, the first substrate 110 is firstly bent in a downward direction (−Z direction) with respect to the bending line r1 to form the first bent portion B1, similar to that illustrated in FIGS. 3 and 4. Here, this firstly bent portion B1 of the first substrate 110 extends from a flat portion thereof disposed in the X-Y plane to an end of the first substrate 110, in a Y-Z plane. As illustrated in FIG. 6, the bent portion (B1 in FIGS. 3 and 4) which is firstly bent is secondarily bent along the second bending line r2 to dispose the second bent portion B2 of the first substrate 110 in a horizontal direction (X direction) toward the display area to be disposed perpendicular to a remainder of the first bent portion B1, thereby forming the second bent portion B2. A back surface of the first substrate 110 at the second bent portion B2 thereof contacts a back surface of the first substrate 110. A secondarily bent angle formed between the first and second bend portions B1 and B2 may be close to about 90 degrees.

As discussed above, by bending the first substrate 110 to dispose the bent portion B1 and layers thereon inclined with respect to the X-Y plane, a planar width of a side portion of the bezel may be reduced and the display device 10 including a relatively narrow bezel may be implemented. Additionally, by further bending the first bent portion B1 to include the second bent portion B2 under a remaining portion of the first substrate 110, an overall thickness of the display device 10 having the relatively narrow bezel may be reduced.

A driving element 310, a pad terminal portion, and a second wiring portion 315 are located further from the display area DA (or closer to the end of the first substrate than a first wiring portion 305. Each of these components are disposed on a same one surface of the second bent portion B2, the same one surface being the upper surface of the first substrate 110 which originally faces a direction toward the second substrate 120 (e.g., in the unbent state of the display panel 100).

Figure 7:
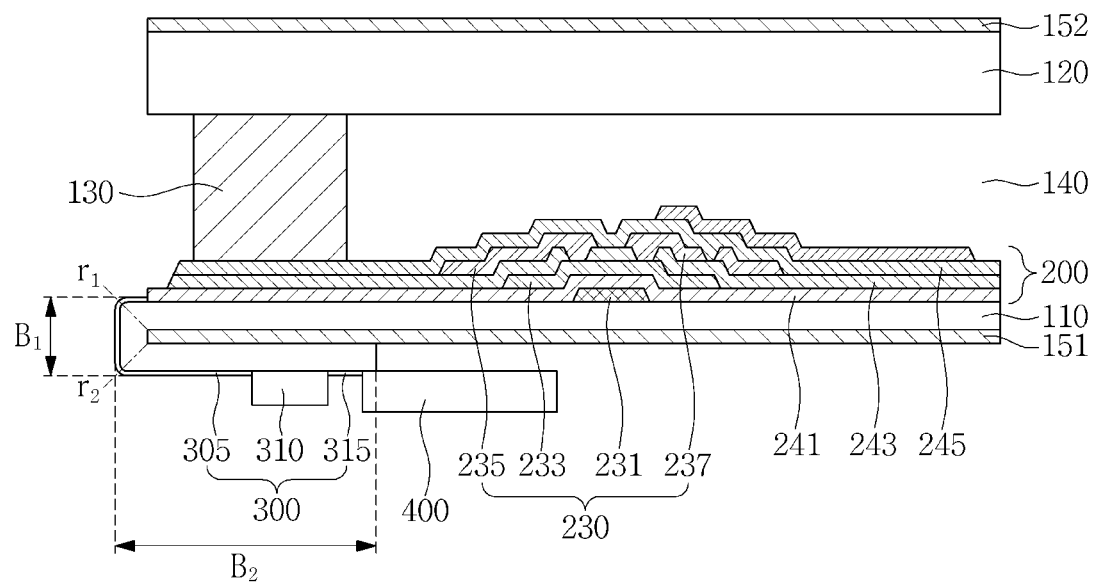
FIG. 7 is a cross-sectional view illustrating a modified exemplary embodiment of the display device of FIG. 5 in a bent state according to the invention.

FIG. 7 is a cross-sectional view illustrating a modified exemplary embodiment of the display device of FIG. 5 in a bent state according to the invention.

As illustrated in FIG. 7, when a polarization plate for compensating optical characteristics is disposed on a display panel 100, a back surface of a first substrate 110 at a second bent portion B2 thereof contacts a back surface of a first polarization plate 151.

FIGS. 8A, 8B, 8C, and 8D are cross-sectional views illustrating an exemplary embodiment of a method of manufacturing a display device according to the invention.

Hereinafter, a method of manufacturing the display device of FIGS. 1, 2 and 3 will be described with reference to FIGS. 8A, 8B, 8C and 8D. However, it will be understood that the method of manufacturing described herein may apply to any of the structures for the display panel 100 described for FIGS. 1 to 7. The layers of the display element portion 200 as a collection of the individual layers labeled in FIGS. 3 and 4 are not separately labeled in FIGS. 8B to 8D for convenience of illustration.

Figure 8A:
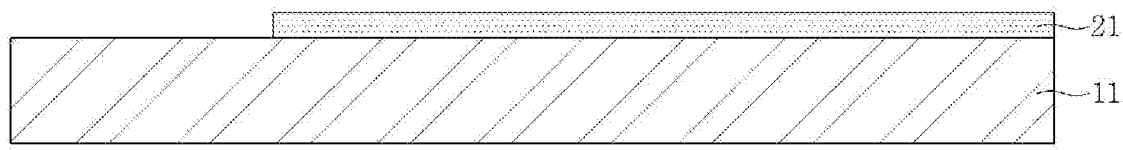
FIGS. 8A, 8B, 8C, and 8D are cross-sectional views illustrating an exemplary embodiment of a method of manufacturing a display device according to the invention.

As illustrated in FIG. 8A, a support substrate 11 is prepared, and a release layer 21 is formed on the support substrate 11.

The support substrate 11 may be a relatively hard glass substrate and serve to support and substantially prevent warping of a thin film substrate disposed thereon due to a relatively small thickness of the thin film substrate.

By performing a manufacturing process including applying heat to the thin film substrate attached to such a hard glass substrate, even if the thin film substrate warps or is elongated by heat during the manufacturing process, thin film patterns such as various electrodes, conductive wirings or the like may be accurately formed at the thin film substrate.

The release layer 21 is a layer for facilitating separation of the thin film substrate from the release layer 21 and the support substrate 11. In an exemplary embodiment, the release layer 21 includes graphene. The release layer 21 may be formed to a thickness in a range from about 10 nanometers (nm) to about 50 nm without being limited thereto.

Graphene has a single-layer structure or multiple-layer structure of carbon atoms which are linked by covalent bonds. In such an example, the carbon atoms may form each layer on the basis of a 6-membered ring, for example, and may further include a 5-membered or 7-membered ring.

Graphene has a relatively high thermal stability by which deformation is not caused even at relatively high temperatures. Thus, the graphene may not be deformed although exposed to a number of relatively high-temperature processes such as used for forming thin film transistors, display elements, wirings and pads, e.g., a crystallization process of amorphous silicon and a dehydrogenation process. Since the graphene may not be deformed, wrinkles of the display panel by layers formed by using the relatively high-temperature processes may be substantially prevented.

The release layer 21 may be formed in a method, for example, in which a graphene oxide dispersion solution is spin-coated to a support substrate, and thermal reduction, chemical reduction or the like is performed thereon. The release layer 21 may be formed to have a total planar area corresponding to a total planar area of the thin film transistor disposed thereon, or alternatively, may be formed to have a total planar area corresponding only to a total planar area of the second substrate 120. That is, the release layer 21 is formed to correspond to at least a total dimension of the second substrate 120.

In an alternative exemplary embodiment, the release layer 21 may be formed using a transfer polymer substrate. In an exemplary embodiment, for example, graphene is grown on a metal layer, including Cu or Ni, which is formed on a metal foil support or a support substrate including Cu or Ni. The grown graphene is then attached to a transfer substrate including a polymer, for example, polydimethylsiloxane ("PDMS") or poly(methylmethacrylate) ("PMMA"). Subsequently, the metal foil support and/or the metal layer is separated from the graphene and the remaining graphene is transferred from the transfer substrate to the support substrate, and thus the release layer is formed.

Figure 8B:
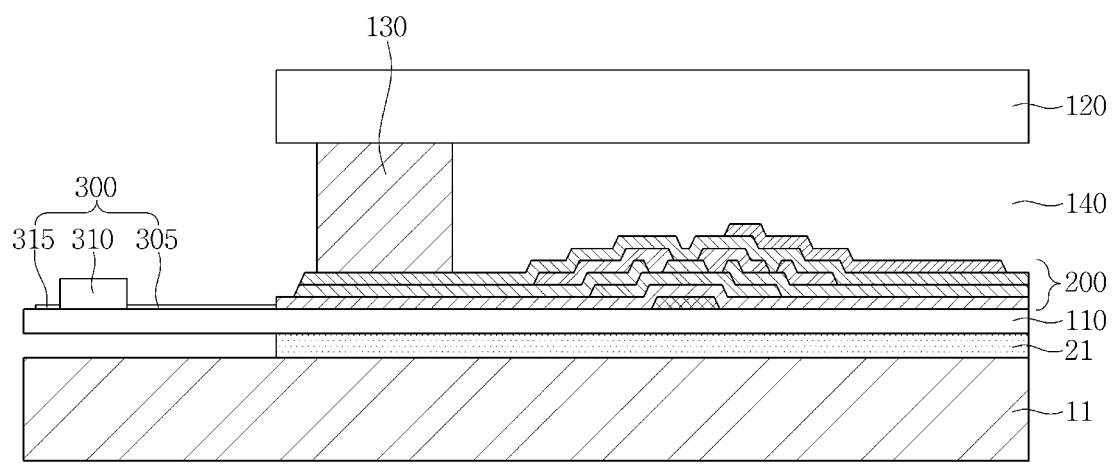

As illustrated in FIG. 8B, as the thin film substrate described above, a first substrate 110 of a display panel 100 is disposed on the release layer 21, a thin film pattern forming process is then performed on the first substrate 110 to form various thin film patterns of the display panel 100 on the first substrate 110, and the second substrate 120 is disposed thereon. The thin film pattern forming process may form elements of the display panel 100 as thin film patterns in the display area DA thereof. The thin film pattern forming process may further form elements of the display panel 100 as thin film patterns in the non-display area thereof. The elements described above may be formed with the first substrate 110 in contact with the release layer 21. In addition, the driving element 310 may be mounted on the first (thin film) substrate 110, or may be integrated onto the substrate together with a transistor of the display area.

The plurality of wirings 300 in the non-display area may be formed together with the thin film patterns described above.

The plurality of wirings 300 include the first wiring portion 305 connecting the thin film pattern of the display panel 110 in the display area DA thereof and the driving element 310 to each other, and the second wiring portion 315 connecting the driving element 310 and the external PCB 400 to each other.

After the first and second substrates 110 and 120 are attached to each other, such as by a sealing portion 130 at corresponding non-display areas of the substrates, liquid crystals are injected between the first substrate 110 and the second substrate 110 to form the liquid crystal layer 140. The driving element 310, e.g., a driving integrated chip ("IC"), may be mounted thereon or integrated thereto.

Referring again to FIGS. 4 and 6, a polarization plate member includes a first polarization plate 151 and a second polarization plate 152 may be disposed on the collection of layers 110-120 described above.

Figure 8C:
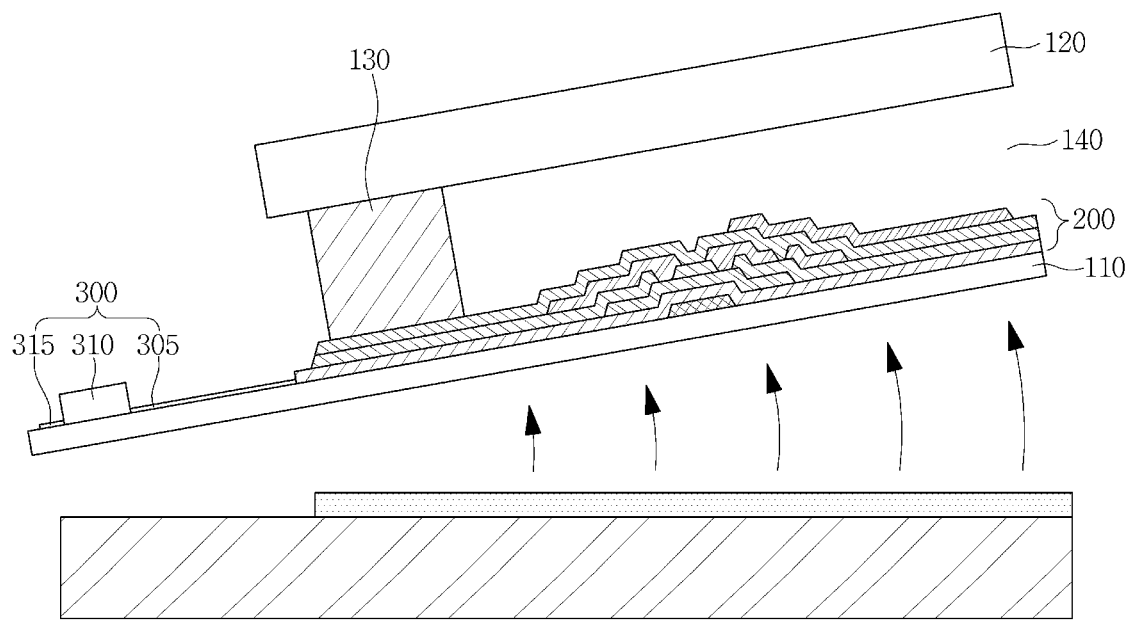

As illustrated in FIG. 8C, the support substrate 11 and the release layer 21 thereon are separated from the first substrate 110 having the various components and elements of the display device disposed thereon. The first substrate 110 together with the various components and elements of the display device may constitute the display device 10 according to one or more exemplary embodiment described above.

Since the release layer 21 according to an exemplary embodiment includes graphene, the release layer 21 and the support substrate 11 may be together easily separated from the first substrate 110 such as by hand (e.g., without an additional process or mechanical tool).

In such an exemplary embodiment, the release layer 21 along with the support substrate 11 is detached from the first substrate 110 having the various components and elements of the display device disposed thereon. The release layer 21 and the support substrate 11 may be together separated from the first substrate 110 having the various components and elements of the display device disposed thereon by a relatively small force of about 200 gram-force (gf) or more and about 300 gf or less.

Figure 8D:
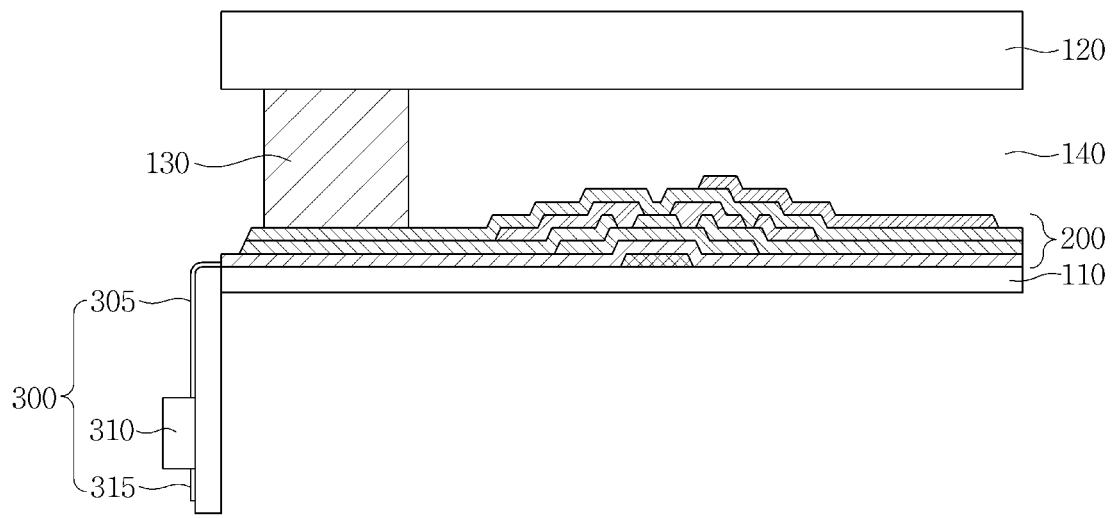

As illustrated in FIG. 8D, a portion of the separated first substrate 110 having the various components and elements of the display device disposed thereon is bent at the pad area PA of the first substrate 110, such as along a bending line. The first wiring 305 which extends across the bending line located in the pad area PA of the first substrate 110 is bent together with the first substrate 110.

In an exemplary embodiment, for example, a portion of the first substrate 110 is bent downwards (−Z direction) with respect to the bending line r1 in the pad area PA. By bending the portion of the first substrate 110 downwards, an edge portion of the first substrate 110 which is opposite to the display area DA of the display panel with respect to the bending line r1 is disposed substantially perpendicular to the display area of the first substrate 110. The bent portion of the first substrate 110 is disposed in a plane which is substantially perpendicular to that plane in which the display area DA is disposed. Accordingly, a portion of the first wiring portion 305 extended in the plane of the first substrate 110 is also bent downwards (−Z direction) with respect to the bending line r1 in the pad area PA.

The driving element 310 and the second wiring 315 which connects the driving element 310 and an external PCB, are located further from the display area DA than the first wiring portion 305. The driving element 310 and the second wiring 315 are located within the plane of the bent portion B1 extended downwards (−Z direction) to be inclined with respect to the display area DA (refer to FIGS. 1 to 4).

In an exemplary embodiment of manufacturing the display device of FIGS. 5, 6 and 7 which is bent two times is formed by secondarily bending the bent portion B1 which is formed by firstly bending the first substrate 110 in FIG. 8D.

In detail, the first bent portion B1 firstly bent at the first bending line r1 is secondarily bent to be disposed perpendicular to the first bent portion B1, such as at a second bending line r2. Thus the second bent portion B2 is formed as in FIG. 6 or FIG. 7. A back surface of the first substrate 110 at the second bent portion B2 thereof as a portion of the first bent portion B1, contacts a back surface of the first substrate 110 directly adjacent to the first bent portion B1.

Accordingly, the first wiring portion 305 disposed in the non-display area to extend across the first bending line r1 and the second bending line r2 is bent two times along the bent portions B1 and B2, respectively.

In the case of a conventional finally-formed flat panel display device, among a first substrate and a second substrate which oppose each other, a total planar area of the first substrate is larger than a total planar area of the second substrate. The difference in size is due to a wiring for transmitting an electric signal applied to a display element in a display area of the first substrate is disposed at a portion of the first substrate exposed from the second substrate. The difference in size is further due to a pad area at an end portion of the corresponding wiring being disposed at a portion of the first substrate which is exposed outside of the second substrate.

Accordingly, in such a conventional completed flat panel display device, a total planar area of a peripheral (edge) area of display device which is outside the display area in which an image is displayed, that is, an area at which display elements are disposed, is inevitably widened. Accordingly, a planar area of a dead space (e.g., non-display area) at which display is not performed adversely increases and a size of a bezel corresponding to the dead space also increases.

However, according to one or more exemplary embodiment of a method of manufacturing the display device according to an exemplary embodiment, in a completed (bent) display device, a total planar area of the first substrate and a total planar area of the second substrate may be substantially equal to each other. That is, a portion of the first substrate which extends further than the second substrate along a plane of the display area is minimized. The similarity in size of the first and second substrates is due to the first wiring portion 305 for applying an electrical signal to the display element in the display area being extended along the first substrate 110 to be bent therewith. Accordingly, the pad area which occupies a relatively large portion of the dead space where an image is not displayed is disposed in a plane inclined with respect to the plane in which the display area of the first substrate 110 is provided. Therefore, different from the completed conventional display device describe above, the bezel size of the completed display device may be significantly reduced at a peripheral area thereof, and further, the display device having essentially no bezel may be implemented.

In addition, in the case of the conventional display device, a manufacturing includes a lower substrate (the first substrate) disposed on a support substrate using an adhesive, such that the support substrate is included in a completed conventional display device. In such a case, in order to bend the first substrate at the pad area, the support substrate is separated from the first substrate, or at least a portion of the support substrate is removed at the pad area to bend the first substrate. In order to separate the support substrate attached using an adhesive, a separate process of laser irradiation may be performed. Heat generated upon laser irradiation may adversely affect a temperature sensitive transistor or the like which is disposed on the first substrate. Therefore, the support substrate may not be entirely separated, and only a portion of the support substrate at the pad area may be separated by cutting and chamfering after laser irradiation. However, even in such a case, there is a problem in that the support substrate of the pad area of a conventional display device may not be completely removed since the driving element of the pad area should be chamfered so as not to be damaged.

However, according to one or more embodiment of a method of manufacturing the display device according to the invention, since the support substrate is completely separated from the first substrate such as by using graphene, the separated first substrate having thin film patterns (e.g., display elements, etc.) thereon is bent without considering chamfering or the like. As such, a bezel size of the completed display device manufacturing according to one or more embodiment of the invention may be remarkably reduced to essential form a bezel-less display device.

Figure 9A:
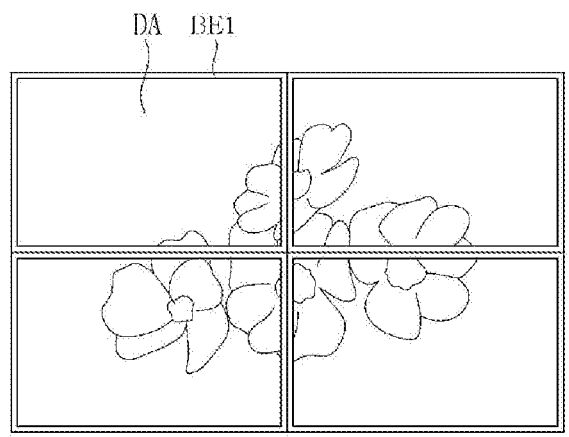
FIG. 9A is a top plan view illustrating a display device including a plurality of conventional display devices.
Figure 9B:
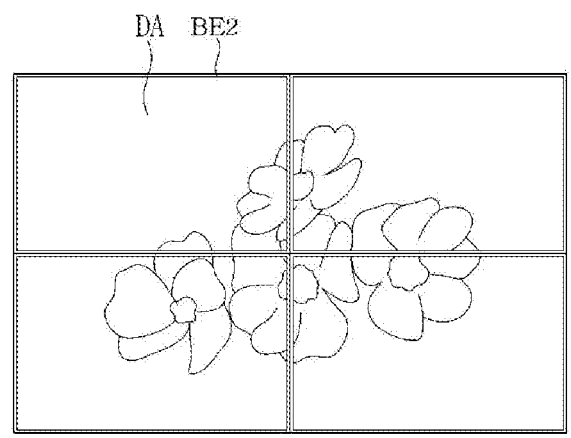
FIG. 9B is a top plan view illustrating an exemplary embodiment of a display device including a plurality of display devices according to the invention.

FIG. 9A is a top plan view illustrating a multi-display display device including a plurality of conventional completed display devices, and FIG. 9B is a top plan view illustrating a multi-display display device including a plurality of completed display devices according to one or more exemplary embodiments described hereinabove with reference to FIGS. 1, 2, 3 and 4 and/or FIGS. 5 and 6.

In a display device according to one or more exemplary embodiment, a first substrate is bent at an end portion thereof where a non-display area or edge of a second substrate ends. In an exemplary embodiment, for example, a side surface of an attached polarization plate which is aligned with an end of the second substrate contacts a bent portion of the first substrate which is bent. Accordingly, a bezel-less completed display device may be realized by reducing a width of a bezel (B2 in FIG. 9B).

It may be appreciated from FIGS. 9A and 9B that a width of a non-display area between display areas DA of adjacent completed display devices may be reduced in a multi-display device including a plurality of completed display devices.

Sizes of bezels BE1 and BE2 and a size of the display area DA illustrated in FIGS. 9A and 9B are not proportional to an actual size of the overall multi-display display device. FIGS. 9A and 9B are explanatory views provided for ease of description to show that a width of a bezel BE2 of the display device including a plurality of completed display devices according to one or more exemplary embodiment is greatly reduced, when comparing a width of a bezel BE1 of a display device including a plurality of conventional completed display devices according to the prior art.

According to one or more exemplary embodiments, a display device and a method of manufacturing the display device may provide the following effects.

A wiring and a driving circuit disposed at a peripheral area (non-display area) are bent at a side surface of a lower substrate (the first substrate) such that a width of a bezel of a completed display device may be reduced. Accordingly, the degree of user's screen immersion may be improved as having a minimized bezel size.

By separating a support substrate from the lower substrate having components and elements of a display device thereon during a process of manufacturing the display device, a total thickness of the completed display device may be reduced.

While the invention has been illustrated and described with reference to the exemplary embodiments thereof, it will be apparent to those of ordinary skill in the art that various changes in form and detail may be formed thereto without departing from the spirit and scope of the invention.

What is claimed is:

1. A display device comprising:
    a first substrate including:
        a display area at which an image is displayed,
        a non-display area adjacent to the display area, and
        a first bent portion in the non-display area thereof, the first bent portion disposed in a plane inclined to a plane in which the display area is disposed;
    a second substrate opposing the first substrate;
    a sealing portion which is disposed in the non-display area and attaches the first substrate and the second substrate to each other; and
    a first polarization plate at a back surface of the first substrate,
    wherein
    the first bent portion of the first substrate contacts an end side surface of the first polarization plate, and
    the end side surface of the first polarization plate is coplanar with an end side surface of the second substrate.

2. The display device of claim 1, further comprising on the first substrate including the first bent portion disposed in the plane inclined to the plane in which the display area is disposed:
    a display element with which the image is displayed, in the display area;
    a driving element from which a driving signal is provided to the display element for displaying the image, in the non-display area; and
    a first wiring portion which connects the driving element and the display element to each other and through which the driving signal is transmitted from the driving element to the display element,
    wherein the first wiring portion extends along the non-display area to be bent along the first bent portion.

3. The display device of claim 2, further comprising:
    a printed circuit board from which the driving signal is provided to the driving element, and
    on the first substrate including the first bent portion disposed in the plane inclined to the plane in which the display area is disposed, a second wiring portion which connects the driving element and the printed circuit board to each other and through which the driving signal is transmitted from the printed circuit board to the driving element,
    wherein the driving element, the printed circuit board and the second wiring portion are disposed along the first bent portion of the first substrate.

4. The display device of claim 1, wherein
    the first bent portion of the first substrate is bent along a bending line defined in the non-display area, and
    along the plane in which the display area is disposed, a distance from the bending line to a boundary between the display area and the non-display area, is in a range from about 1 millimeter to about 4 millimeters.

5. The display device of claim 1, wherein the first substrate comprises polyimide.

6. The display device of claim 1, further comprising on the first substrate including the first bent portion disposed in the plane inclined to the plane in which the display area is disposed:
    a display element with which the image is displayed, in the display area,
    a driving element from which a driving signal is provided to the display element for displaying the image, in the non-display area, and
    a first wiring portion which connects the driving element and the display element to each other and through which the driving signal is transmitted from the driving element to the display element,
    wherein
    the first substrate further comprises a second bent portion extended from an end of the first bent portion, the second bent portion disposed in a plane inclined to the plane in which the first bent portion is disposed,
    the second bent portion of the first substrate contacts a back surface of the first polarization plate, and
    the first wiring portion extends along the non-display area to be bent along the first bent portion and along the second bent portion.

7. A display comprising:
    a first substrate including:
        a display area at which an image is displayed,
        a non-display area adjacent to the display area,
        a first bent portion in the non-display area thereof, the first bent portion disposed in a plane inclined to a plane in which the display area is disposed, and
        a second bent portion extended from an end of the first bent portion, the second bent portion disposed in a plane inclined to the plane in which the first bent portion is disposed;
    a second substrate opposing the first substrate;

a sealing portion which is disposed in the non-display area and attaches the first substrate and the second substrate to each other;

a display element with which the image is displayed, in the display area;

a driving element from which a driving signal is provided to the display element for displaying the image, in the non-display area;

a first wiring portion which connects the driving element and the display element to each other and through which the driving signal is transmitted from the driving element to the display element;

a printed circuit board from which the driving signal is provided to the driving element, and on the first substrate including the first and second bent portions in planes inclined with respect to each other, a second wiring portion which connects the driving element and the printed circuit board to each other and through which the driving signal is transmitted from the printed circuit board to the driving element, wherein the driving element, the printed circuit board and the second wiring portion are disposed along the second bent portion, the second bent portion of the first substrate contacts a back surface of the first substrate, the first wiring portion extends along the non-display area to be bent along the first bent portion and along the second bent portion, and the display element, the driving element and the first wiring portion are disposed on the first substrate including the first bent portion disposed in the plane inclined to the plane in which the display area is disposed.

8. A display device:

a first substrate including:
- a display area at which an image is displayed,
- a non-display area adjacent to the display area, and
- a first bent portion in the non-display area thereof, the first bent portion disposed in a plane inclined to a plane in which the display area is disposed;

a second substrate opposing the first substrate;

a sealing portion which is disposed in the non-display area and attaches the first substrate and the second substrate to each other; and a second polarization plate at a front surface of the second substrate, wherein an end side surface of the second polarization plate is coplanar with an end side surface of the second substrate.

* * * * *